(12) United States Patent
Nagasawa et al.

(10) Patent No.: US 11,955,390 B2
(45) Date of Patent: Apr. 9, 2024

(54) SEMICONDUCTOR WAFER EVALUATION METHOD AND SEMICONDUCTOR WAFER MANUFACTURING METHOD

(71) Applicant: SUMCO CORPORATION, Tokyo (JP)

(72) Inventors: Takahiro Nagasawa, Saga (JP); Yasuyuki Hashimoto, Saga (JP); Hirotaka Kato, Nagasaki (JP)

(73) Assignee: SUMCO CORPORATION, Tokyo (JP)

( * ) Notice: Subject to any disclaimer, the term of this patent is extended or adjusted under 35 U.S.C. 154(b) by 937 days.

(21) Appl. No.: 16/962,559

(22) PCT Filed: Jan. 7, 2019

(86) PCT No.: PCT/JP2019/000042
§ 371 (c)(1),
(2) Date: Jul. 16, 2020

(87) PCT Pub. No.: WO2019/142662
PCT Pub. Date: Jul. 25, 2019

(65) Prior Publication Data
US 2020/0411391 A1 Dec. 31, 2020

(30) Foreign Application Priority Data
Jan. 18, 2018 (JP) .................. 2018-006193

(51) Int. Cl.
*H01L 21/66* (2006.01)
*G01N 21/88* (2006.01)
*G01N 21/95* (2006.01)

(52) U.S. Cl.
CPC ......... *H01L 22/20* (2013.01); *G01N 21/8806* (2013.01); *G01N 21/9503* (2013.01); *G01N 2021/8825* (2013.01)

(58) Field of Classification Search
CPC .... G01N 21/9503; G01N 21/47; G01N 21/55; G01N 21/9501; G01N 21/8806;
(Continued)

(56) References Cited

U.S. PATENT DOCUMENTS

| | | | |
|---|---|---|---|
| 2008/0013822 A1* | 1/2008 | Pai ..................... | G01N 21/9503 382/199 |
| 2010/0053603 A1* | 3/2010 | Sakaguchi ............ | G01B 11/30 356/237.4 |

(Continued)

FOREIGN PATENT DOCUMENTS

| | | |
|---|---|---|
| CN | 102648405 A | 8/2012 |
| CN | 107039300 A | 8/2017 |

(Continued)

OTHER PUBLICATIONS

Office Action for TW App. No. 108100504, dated Mar. 23, 2021 (w/ translation).

(Continued)

*Primary Examiner* — Hoa Q Pham
(74) *Attorney, Agent, or Firm* — Greenblum & Bernstein, P.L.C.

(57) ABSTRACT

A semiconductor wafer evaluation method includes acquiring a reflection image as a bright-field image by receiving reflected light which is obtained when irradiating one surface side of a semiconductor wafer to be evaluated with light; acquiring a scattered image as a dark-field image by receiving scattered light which is obtained when irradiating the surface side of the semiconductor wafer with light; and obtaining a distance between a bright zone that is observed in the reflection image and a bright zone that is observed in the scattered image. The semiconductor wafer to be evaluated is a semiconductor wafer in which a chamfered surface is formed in a wafer outer peripheral edge section, and the method includes evaluating a shape of a boundary part (Continued)

between a main surface on the surface side irradiated with the light of the semiconductor wafer to be evaluated and a chamfered surface adjacent to the main surface.

7 Claims, 6 Drawing Sheets

(58) Field of Classification Search
CPC . G01N 2021/8825; H01L 22/12; H01L 22/20; G06T 2207/10016; G06T 7/0004
USPC .................. 356/237.1–237.5; 382/145, 152
See application file for complete search history.

(56) References Cited

U.S. PATENT DOCUMENTS

| 2010/0060891 | A1* | 3/2010 | Torii | G01N 21/9503 |
| | | | | 356/237.5 |
| 2013/0323153 | A1 | 12/2013 | Hoshi et al. | |
| 2014/0253910 | A1 | 9/2014 | Lewis | |
| 2015/0330914 | A1 | 11/2015 | Maleev et al. | |

FOREIGN PATENT DOCUMENTS

| JP | 2003-177100 A | | 6/2003 |
| JP | 2006040961 A | * | 2/2006 |
| JP | 2015-102364 | | 6/2015 |
| JP | 2016-130738 | | 7/2016 |
| JP | 2017-526158 | | 9/2017 |
| WO | 2015/179233 | | 11/2015 |

OTHER PUBLICATIONS

Office Action for DE App. No. 112019000461.1, dated Jan. 18, 2023 (w/ partial translation).
Office Action for CN App. No. 201980009001.3, dated Jan. 19, 2023 (w/ translation).
IPRP for PCT/JP2019/000042, dated Jul. 30, 2020 (w/ translation).
Official Communications issued in International Bureau of Wipo Patent Application No. PCT/JP2019/000042, International Search Report dated Feb. 26, 2019.
Office Action issued in Taiwan Counterpart Patent Appl. No. 108100504, dated Nov. 29, 2019, along with an English translation thereof.
Office Action issued in Taiwan Counterpart Patent Appl. No. 108100504, dated Apr. 23, 2020, along with an English translation thereof.
Official Communications issued in International Bureau of WIPO Patent Application No. PCT/JP2019/000042, Written Opinion dated Feb. 26, 2019.

* cited by examiner

| Wafer 1 | Wafer 2 | Wafer 3 | Wafer 4 |

SEMICONDUCTOR WAFER EVALUATION METHOD AND SEMICONDUCTOR WAFER MANUFACTURING METHOD

CROSS-REFERENCE TO RELATED APPLICATIONS

This application claims the benefit of priority to Japanese Patent Application No. 2018-006193 filed on Jan. 18, 2018, which is expressly incorporated herein by reference in its entirety.

TECHNICAL FIELD

The present invention relates to a semiconductor wafer evaluation method and a semiconductor wafer manufacturing method.

BACKGROUND ART

In recent years, evaluations of a shape of a wafer outer peripheral edge section are being performed with respect to semiconductor wafers (for example, refer to Japanese Patent Application Laid-open No. 2016-130738, which is expressly incorporated herein by reference in its entirety).

SUMMARY OF INVENTION

A semiconductor wafer is generally manufactured by subjecting a wafer cut out from an ingot to various types of processes. Since an outer peripheral edge section of a wafer cut out from an ingot has corners, the outer peripheral edge section without modification is susceptible to cracks and chips. In consideration thereof, normally, a chamfered surface is formed by applying chamfering to an outer peripheral edge section of at least one of a surface (a front surface) to be a device formation surface side of a semiconductor wafer and a surface (a rear surface) on an opposite side of the front surface. Regarding the chamfered surface, Japanese Patent Application Laid-open No. 2016-130738 proposes acquiring an image so that a chamfered surface is displayed in white and calculating a width dimension of the chamfered surface from a width dimension of the image (refer to paragraphs 0060 to 0062 in Japanese Patent Application Laid-open No. 2016-130738). Hereinafter, unless otherwise noted, it is assumed that a "surface" of a semiconductor wafer refers to one of or both the front surface and the rear surface described above.

Among the surfaces of a semiconductor wafer, a main surface on the front surface side is a plane on which a device is to be formed, and a plane on an opposite side thereof is a main surface on the rear surface side. The chamfered surface formed in the wafer outer peripheral edge section has a planar shape that is inclined with respect to an adjacent main surface. Therefore, a cross-sectional shape of the semiconductor wafer in a thickness direction changes significantly at a boundary part between a main surface and a chamfered surface adjacent to the main surface. The shape of the boundary part between the main surface and the chamfered surface can be used as an index for predicting a likelihood of occurrence of chips and scratches or the like in a manufacturing process of a semiconductor device. For example, in the manufacturing process of a semiconductor device, by appropriately configuring a shape of the boundary part between the wafer surface (for example, the rear surface) and the chamfered surface so as to conform to a shape of a wafer support that supports the wafer during heat treatment, since chips and scratches of the boundary part due to contact are less likely to occur, occurrences of dislocation (slippage) and dust caused by such chips and scratches can be reduced. However, since the method described in Japanese Patent Application Laid-open No. 2016-130738 is a method of obtaining a width dimension of a chamfered surface, a shape of a boundary part between a chamfered surface and a main surface cannot be evaluated by the method described in Japanese Patent Application Laid-open No. 2016-130738.

An aspect of the present invention provides for a novel method for evaluating a shape of a boundary part between a chamfered surface and a main surface of a semiconductor wafer.

An aspect of the present invention relates to a semiconductor wafer evaluation method (hereinafter, also simply referred to as an "evaluation method") including:

acquiring a reflection image as a bright-field image by receiving reflected light which is obtained when irradiating one surface side of a semiconductor wafer to be evaluated with light;

acquiring a scattered image as a dark-field image by receiving scattered light which is obtained when irradiating the surface side of the semiconductor wafer to be evaluated with light; and obtaining a distance L between a bright zone that is observed in the reflection image and a bright zone that is observed in the scattered image, wherein the semiconductor wafer to be evaluated is a semiconductor wafer in which a chamfered surface is formed in a wafer outer peripheral edge section, and the method including:

evaluating, based on L, a shape of a boundary part between a main surface on the surface side irradiated with the light of the semiconductor wafer to be evaluated and a chamfered surface adjacent to the main surface.

Extensive research carried out by the present inventors led to a new finding with respect to the distance L in that, the gentler the shape of the boundary part between the chamfered surface and the main surface, the larger a value of L, and the steeper the shape of the boundary part between the chamfered surface and the main surface, the smaller the value of L. Therefore, based on the value of L, a gentleness/steepness of the shape of the boundary part between the main surface and the chamfered surface can be evaluated.

In an embodiment, the evaluation method can include acquiring the scattered image by irradiating a portion that includes at least a region on a side of the boundary part of the chamfered surface and a region on a side of the chamfered surface of the boundary part with light from outside of upward in a vertical direction of the boundary part.

In an embodiment, the evaluation method can include acquiring the reflection image by irradiating a portion that includes at least a region on a side of the boundary part of the main surface and a region on a side of the main surface of the boundary part with light from upward in a vertical direction of the boundary part.

In an embodiment, the evaluation method can include acquiring the scattered image and the reflection image a plurality of times by rotating the semiconductor wafer to be evaluated around a normal direction of the main surface, and obtaining L at a plurality of different locations of the semiconductor wafer to be evaluated.

Another aspect of the present invention relates to a semiconductor wafer manufacturing method including:

manufacturing a semiconductor wafer to be a candidate for shipping as a product;

evaluating the candidate semiconductor wafer by the above evaluation method; and subjecting a semiconductor wafer determined to be a non-defective product as a result of the evaluation to preparation for shipment as a product semiconductor wafer.

Yet another aspect of the present invention relates to a semiconductor wafer manufacturing method including:

manufacturing a semiconductor wafer lot including a plurality of semiconductor wafers;

extracting at least one semiconductor wafer from the semiconductor wafer lot;

evaluating the extracted semiconductor wafer by the above evaluation method; and subjecting semiconductor wafers belonging to a same semiconductor wafer lot as a semiconductor wafer determined to be a non-defective product as a result of the evaluation to preparation for shipment as product semiconductor wafers.

Yet another aspect of the present invention relates to a semiconductor wafer manufacturing method including:

manufacturing an evaluation semiconductor wafer under a test manufacturing condition;

evaluating the manufactured evaluation semiconductor wafer by the above evaluation method;

determining a manufacturing condition created by modifying the test manufacturing condition as an actual manufacturing condition or determining the test manufacturing condition as the actual manufacturing condition on the basis of a result of the evaluation; and manufacturing semiconductor wafers under the determined actual manufacturing condition.

In an embodiment, the manufacturing condition to be modified can be at least one of a polishing condition and a chamfering condition of a semiconductor wafer surface.

According to an aspect of the present invention, a novel method for evaluating a shape of a boundary part between a chamfered surface and a main surface of a semiconductor wafer can be provided.

DESCRIPTION OF EMBODIMENTS

Semiconductor Wafer Evaluation Method

Figure 1:
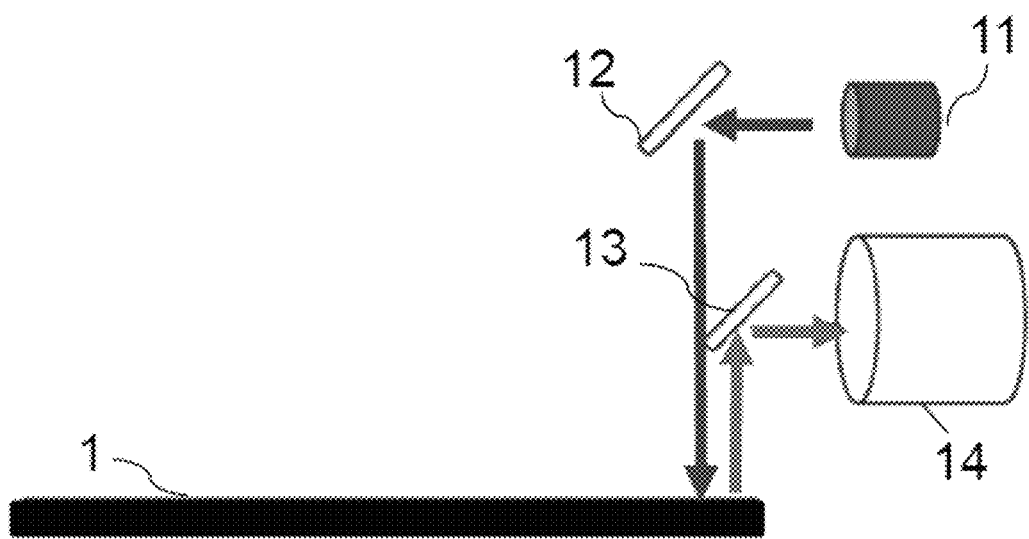
FIG. 1 shows a schematic configuration diagram of a light-irradiating system and a light-receiving system which are used in order to acquire a reflection image in Examples.

An aspect of the present invention relates to a semiconductor wafer evaluation method including: acquiring a reflection image as a bright-field image by receiving reflected light which is obtained when irradiating one surface side of a semiconductor wafer to be evaluated with light; acquiring a scattered image as a dark-field image by receiving scattered light which is obtained when irradiating the surface side of the semiconductor wafer to be evaluated with light; and obtaining a distance L between a bright zone that is observed in the reflection image and a bright zone that is observed in the scattered image, wherein the semiconductor wafer to be evaluated is a semiconductor wafer in which a chamfered surface is formed in a wafer outer peripheral edge section, and the method including evaluating, based on L, a shape of a boundary part between a main surface on the surface side irradiated with the light of the semiconductor wafer to be evaluated and a chamfered surface adjacent to the main surface.

Hereinafter, the evaluation method will be described in greater detail.

Semiconductor Wafer to be Evaluated

The semiconductor wafer to be evaluated in the above evaluation method need only be a semiconductor wafer of which an outer peripheral edge section is subjected to chamfering and a chamfered surface is formed. The semiconductor wafer to be evaluated can be various types of semiconductor wafers generally used as semiconductor substrates. For example, specific examples of the semiconductor wafers include various types of silicon wafers. For example, a silicon wafer can be a silicon single-crystal wafer cut out from a silicon single-crystal ingot and subjected to various types of processes including chamfering. Specific examples of the silicon single-crystal wafer include a polished wafer having been subjected to polishing and having a polished surface. In addition, the silicon wafer can be various types of silicon wafers including an epitaxial wafer having an epitaxial layer on a silicon single-crystal wafer and an annealed wafer in which a modifying layer is formed on a silicon single-crystal wafer by annealing.

Acquisition of Reflection Image and Scattered Image

Light irradiation for acquisition of a reflection image and light irradiation for scattered image acquisition are performed toward a side of a surface of the semiconductor wafer to be evaluated, that includes a boundary part, the shape of which is a target of the evaluation. The present inventors consider that a bright zone observed in a reflection image (a bright-field image) acquired by the light irradiation corresponds to a boundary part-side region of a main surface that is adjacent to a chamfered surface via a boundary part, and a bright zone observed in a scattered image (a dark-field image) corresponds to a boundary part-side region of the chamfered surface that is adjacent to the main surface via the boundary part. The present inventors further consider that a region between both bright zones correspond to the boundary part, and a distance L between both bright zones corresponds to a width of the boundary part that is observed when the semiconductor wafer to be evaluated is viewed from a side of a surface including the boundary part, the shape of which is a target of the evaluation. Extensive research carried out by the present inventors led to a new finding in that, the gentler the shape of the boundary part, the wider the width, and the steeper the shape of the boundary part, the narrower the width. Therefore, the distance L between both bright zones can be considered an index of a shape evaluation of the boundary part. Specifically, a determination can be made that the larger a value of L, the gentler the shape of the boundary part, and the smaller the value of L, the steeper the shape of the boundary part.

Hereinafter, each of acquisition of a reflection image and acquisition of a scattered image will be described in further detail.

Acquisition of Reflection Image

The evaluation method described above includes acquiring a reflection image as a bright-field image by receiving reflected light which is obtained when irradiating a surface side including a boundary part, the shape of which is a target of the evaluation, of a semiconductor wafer to be evaluated with light. From the perspective of easiness of evaluation, a wavelength of light to be irradiated in order to acquire a reflection image is preferably a wavelength in a visible light region (a range from 360 to 830 nm) which can be accommodated by a light source and a light-receiving section which are readily available. Light-irradiating systems with known configurations can be used as the light-irradiating system for acquiring reflection images. For example, examples of a light source to be used for light irradiation for the purpose of acquiring reflection images include known light sources such as an LED (a light-emitting diode). In the present invention and in the present specification, with upward in a vertical direction (this direction coincides with "a normal direction of a main surface") of the boundary part, the shape of which is a target of the evaluation, as a reference, a side of a wafer outer peripheral edge section will be referred to as outside and a side of a wafer main surface will be referred to as inside. With upward in the vertical direction as a 0° direction of reference, when a wafer radial direction which is perpendicular to the 0° direction and which passes through the boundary part, the shape of which is a target of the evaluation, is considered a 90° direction, light irradiation for acquiring reflected light is preferably performed from upward in the vertical direction (0° direction) from the perspective of acquiring reflected light with higher intensity. In the present invention and in the present specification, it is to be understood that errors of around 1° to 3° are permissible with respect to descriptions related to angles and directions.

In addition, a portion to be irradiated with light for acquiring reflection images on a surface of the semiconductor wafer to be evaluated preferably includes at least a boundary part-side region of the main surface and a main surface-side region of the boundary part. Light-receiving systems with known configurations can be used as the light-receiving system for acquiring reflection images. For example, the light-receiving system can include a mirror for guiding reflected light from the semiconductor wafer surface to a light-receiving section. In addition, for example, a line scan camera can be used as the light-receiving section. The present inventors consider that a bright zone observed in a reflection image (a bright-field image) acquired in this manner corresponds to a boundary part-side region of the main surface that is adjacent to the chamfered surface via the boundary part. In principle, since a reflection image is acquired as an image similar to a binary image, a boundary between a bright part and a dark part is clear and readily identifiable in a reflection image.

Acquisition of Scattered Image

The above evaluation method includes acquiring a scattered image as a dark-field image by receiving scattered light which is obtained when irradiating the surface side including the boundary part, the shape of which is a target of the evaluation, of a semiconductor wafer to be evaluated with light. From the perspective of easiness of evaluation, a wavelength of light to be irradiated in order to acquire a scattered image is preferably a wavelength in a visible light region (a range from 360 to 830 nm) which can be accommodated by a light source and a light-receiving section which are readily available. Light-irradiating systems with known configurations can be used as the light-irradiating system for acquiring scattered images. For example, examples of a light source to be used for light irradiation for acquiring scattered images include known light sources such as an LED. Light irradiation for acquiring scattered images is preferably performed from outside of upward in the vertical direction of the boundary part, the surface of which is a target of the evaluation. With upward in the vertical direction as a 0° direction of reference, when a wafer radial direction which is perpendicular to the 0° direction and which passes through the boundary part, the shape of which is a target of the evaluation, is considered a 90° direction, light irradiation for acquiring scattered light is preferably performed from a direction ranging from a 10° outside direction to a 50° outside direction relative to upward in the vertical direction (0° direction), more preferably performed from a direction ranging from a 20° outside direction to a 40° outside direction, and even more preferably performed from the 20° outside direction from the perspective of acquiring scattered light with higher intensity.

In addition, a portion to be irradiated with light for acquiring scattered images on a surface of the semiconductor wafer to be evaluated preferably includes at least a boundary part-side region of the chamfered surface and a chamfered surface-side region of the boundary part. Light-receiving systems with known configurations can be used as the light-receiving system for acquiring scattered images. For example, the light-receiving system can include a mirror for guiding scattered light from the semiconductor wafer surface to a light-receiving section. In addition, for example, a line scan camera can be used as the light-receiving section. The present inventors consider that a bright zone observed in a scattered image (a dark-field image) acquired in this manner corresponds to a boundary part-side region of the chamfered surface that is adjacent to the main surface via the boundary part. With respect to a scattered image, by setting a threshold to brightness, a bright zone can be identified by separating the scattered image into a bright part being a portion, the brightness of which is equal to or higher than the threshold, and a dark part being a portion, the brightness of which is lower than the threshold. For example, the threshold of brightness can be set to 0.

The acquisition of a reflection image and the acquisition of a scattered image described above can be performed in any order.

Shape Evaluation of Boundary Part

After identifying a bright zone in a reflection image (a bright-field image) and a bright zone in a scattered image (a dark-field image) as described above, a distance L between both bright zones is obtained. The distance L can be obtained as a shortest distance between an end (a boundary between a bright part and a dark part) on an outer peripheral edge section-side of the bright zone identified in the reflection image and an end (a boundary between a bright part and a dark part) on a main surface-side of the bright zone identified in the scattered image. A method of obtaining the distance L is not particularly limited. For example, the distance L between both bright zones can be obtained by superimposing the reflection image and the scattered image on each other or arranging the reflection image and the scattered image side by side by known image processing.

The shape evaluation of the boundary part can be performed based on L described above. Specifically, a determination can be made that the smaller a value of L, the steeper the shape of the boundary part, and a determination can be made that the larger the value of L, the gentler the shape of the boundary part. Being capable of evaluating the shape of the boundary part using the value of L as described above enables the evaluation to be performed in an objective manner on the basis of a numerical value and is preferable from the perspective of reliability of the evaluation.

As described above, according to the above evaluation method, a shape of a boundary part between a main surface and a chamfered surface adjacent to the main surface on a wafer surface (a front surface or a rear surface) of a semiconductor wafer can be evaluated.

In addition, the above evaluation method can be carried out without having to cut out (for example, cleaving) a specimen piece from the semiconductor wafer to be evaluated. In other words, the above evaluation method enables non-destructive evaluation. This is preferable from the perspective of enabling simple evaluation. Furthermore, this is also preferable from the perspective of easiness of shape evaluation of a boundary part at a plurality of different locations of a same semiconductor wafer. For example, in an embodiment, the above evaluation method can include acquiring the reflection image and the scattered image a plurality of times by rotating the semiconductor wafer to be evaluated around a normal direction of the main surface, and obtaining L at a plurality of different locations of the semiconductor wafer to be evaluated. The shape of the boundary part at each location can be evaluated based on each of the plurality of values of L obtained in this manner. In addition, a representative value (for example, an average value (for example, an arithmetic mean), a minimum value, or a maximum value) of a plurality of values of L obtained by evaluations at different locations of a same semiconductor wafer can be adopted as an index of shape evaluation of the boundary part of the semiconductor wafer.

Semiconductor Wafer Manufacturing Method

A semiconductor wafer manufacturing method (a first manufacturing method) according to an aspect of the present invention is a semiconductor wafer manufacturing method including:
 manufacturing a semiconductor wafer to be a candidate for shipping as a product;
 evaluating the candidate semiconductor wafer by the above evaluation method; and
 subjecting a semiconductor wafer determined to be a non-defective product as a result of the evaluation to preparation for shipment as a product semiconductor wafer.

A semiconductor wafer manufacturing method (a second manufacturing method) according to another aspect of the present invention is a semiconductor wafer manufacturing method including:
 manufacturing a semiconductor wafer lot including a plurality of semiconductor wafers;
 extracting at least one semiconductor wafer from the semiconductor wafer lot;
 evaluating the extracted semiconductor wafer by the above evaluation method; and
 subjecting semiconductor wafers belonging to a same semiconductor wafer lot as a semiconductor wafer determined to be a non-defective product as a result of the evaluation to preparation for shipment as product semiconductor wafers.

A semiconductor wafer manufacturing method (a third manufacturing method) according to yet another aspect of the present invention is a semiconductor wafer manufacturing method including:
 manufacturing an evaluation semiconductor wafer under a test manufacturing condition;
 evaluating the manufactured evaluation semiconductor wafer by the above evaluation method;
 determining a manufacturing condition created by modifying the test manufacturing condition as an actual manufacturing condition or determining the test manufacturing condition as the actual manufacturing condition on the basis of a result of the evaluation; and
 manufacturing semiconductor wafers under the determined actual manufacturing condition.

In the first manufacturing method, an evaluation by the above evaluation method is performed as a so-called pre-shipment inspection. In addition, in the second manufacturing method, semiconductor wafers in a same lot as a semiconductor wafer having been determined as a non-defective product as a result of a so-called sampling inspection are prepared to be shipped as product semiconductor wafers. In the third manufacturing method, a semiconductor wafer manufactured under the test manufacturing condition is evaluated and the actual manufacturing condition is determined on the basis of a result of the evaluation. In any of the first manufacturing method, the second manufacturing method, and the third manufacturing method, the evaluation of the semiconductor wafer is performed by the evaluation method according to an aspect of the present invention described earlier.

First Manufacturing Method

In the first manufacturing method, a semiconductor wafer lot as a candidate to be shipped as products can be manufactured in a similar manner to general semiconductor wafer manufacturing methods. For example, a polished wafer that is an embodiment of a silicon wafer can be manufactured by manufacturing processes including: cutting (slicing) of a silicon wafer from a silicon single-crystal ingot grown by the Czochralski method (CZ method) or the like; chamfering; rough polishing (for example, lapping); etching; mirror polishing (final polishing); and cleaning to be performed between or after these working processes. In addition, an annealed wafer can be manufactured by subjecting a polished wafer manufactured as described above to annealing. An epitaxial wafer can be manufactured by vapor-phase growing (epitaxial growing) of an epitaxial layer on a surface of a polished wafer manufactured as described above.

With respect to the manufactured semiconductor wafer, a shape of a boundary part between a main surface and a chamfered surface adjacent to the main surface is evaluated by the evaluation method according to an aspect of the present invention. Details of the evaluation method are as described earlier. Subsequently, as a result of the evaluation, a semiconductor wafer determined as a non-defective product is subjected to preparation for shipment as a product semiconductor wafer. A criterion for determining a non-defective product can be determined in accordance with a quality required of a product semiconductor wafer. For example, in an embodiment, an obtained value of L being equal to or larger than a certain value (in other words, equal to or larger than a threshold) can be adopted as the criterion for determining a non-defective product. In addition, a representative value (for example, an average value (for example, an arithmetic mean), a minimum value, or a maximum value) of a plurality of values of L obtained by evaluations at different locations of a same semiconductor wafer can be used as the value of L to be used for determining a non-defective product. This similarly applies to the second manufacturing method and the third manufacturing method. Examples of the preparation for shipment as a product semiconductor wafer include packaging. In this manner, according to the first manufacturing method, semiconductor wafers having the boundary part between the main surface and the chamfered surface, the shape of which is a shape desired in a product semiconductor wafer, can be supplied to the market in a stable manner.

Second Manufacturing Method

A semiconductor wafer lot can be manufactured according to the second manufacturing method in a similar manner to general semiconductor wafer manufacturing methods as already described with respect to the first manufacturing method. The total number of semiconductor wafers included in a semiconductor wafer lot is not particularly limited. The number of semiconductor wafers to be sampled from a manufactured semiconductor wafer lot and submitted to a so-called sampling inspection is at least one and may be two or more, and the number is not particularly limited.

With respect to a semiconductor wafer extracted from the semiconductor wafer lot, a shape of a boundary part between a main surface and a chamfered surface adjacent to the main surface is evaluated by the evaluation method according to an aspect of the present invention. Details of the evaluation method are as described earlier. Subsequently, as a result of the evaluation, the semiconductor wafers in the same semiconductor wafer lot as a semiconductor wafer determined as a non-defective product are subjected to preparation for shipment as product semiconductor wafers. A criterion for determining a non-defective product can be determined in accordance with a quality required of a product semiconductor wafer. For example, in an embodiment, an obtained value of L being equal to or larger than a certain value (in other words, equal to or larger than a threshold) can be adopted as the criterion for determining a non-defective product. Examples of the preparation for shipment as a product semiconductor wafer are as described earlier with respect to the first manufacturing method. According to the second manufacturing method, semiconductor wafers having the boundary part between the main surface and the chamfered surface, the shape of which is a shape desired in a product semiconductor wafer, can be supplied to the market in a stable manner. In addition, since the evaluation method according to an aspect of the present invention enables non-destructive evaluation, in an embodiment of the second manufacturing method, as long as a semiconductor wafer extracted from a semiconductor wafer lot and subjected to evaluation is determined by the evaluation to be a non-defective product, the semiconductor wafer can also be subjected to preparation for shipment as a product semiconductor wafer and shipped as a product semiconductor wafer after the preparation.

Third Manufacturing Method

Examples of types of the test manufacturing condition and the actual manufacturing condition in the third manufacturing method include various types of conditions in various types of processes for manufacturing a semiconductor wafer. The various types of processes for manufacturing a semiconductor wafer are as described earlier with reference to the first manufacturing method. It is assumed that the "actual manufacturing condition" refers to a manufacturing condition of a product semiconductor wafer.

In the third manufacturing method, the test manufacturing condition is set as a preliminary step toward determining the actual manufacturing condition, and an evaluation semiconductor wafer is manufactured under the test manufacturing condition. With respect to the manufactured semiconductor wafer, a shape of a boundary part between a main surface and a chamfered surface adjacent to the main surface is evaluated by the evaluation method according to an aspect of the present invention. Details of the evaluation method are as described earlier. The number of evaluation semiconductor wafers is at least one and may be two or more, and the number is not particularly limited. As a result of the evaluation, when the shape of the boundary part of the evaluation semiconductor wafer is a shape desired in a product semiconductor wafer, by manufacturing product semiconductor wafers under the test manufacturing condition as an actual manufacturing condition and shipping the product semiconductor wafers, product semiconductor wafers in which the shape of the boundary part is a desired shape can be supplied to the market in a stable manner. On the other hand, as a result of the evaluation, when the shape of the boundary part of the evaluation semiconductor wafer differs from the shape desired in a product semiconductor wafer, the manufacturing condition created by modifying the test manufacturing condition is determined as the actual manufacturing condition. The manufacturing condition to be modified is preferably a manufacturing condition that conceivably affects the shape of the boundary part. Examples of such a manufacturing condition include a polishing condition of a surface (a front surface and/or a rear surface) of a semiconductor wafer. Specific examples of the polishing condition include a rough polishing condition and a mirror polishing condition and, more specifically, a type of a polishing solution, an abrasive grain concentration of the polishing solution, a type of a polishing pad (for example, hardness), and the like. In addition, examples of the manufacturing condition include a chamfering condition, more specifically, a machining condition such as grinding or polishing during the chamfering, and even more specifically, a type of a polishing tape or the like used in the chamfering. By determining the manufacturing condition created by modifying the test manufacturing condition as actual manufacturing conditions, manufacturing product semiconductor wafers under the actual manufacturing condition, and shipping the product semiconductor wafers, product semiconductor wafers in which the shape of the boundary part is a desired shape can be supplied to the market in a stable manner. Processes of once again manufacturing an evaluation semiconductor wafer under the manufacturing condition created by modifying the test manufacturing condition, evaluating the evaluation semiconductor wafer by the evaluation method according to an aspect of the present invention, and either adopting the manufacturing condition as an actual manufacturing condition or further modifying the manufacturing condition may be repeated once or twice or more.

In the third manufacturing method described above, with respect to a method of determining whether or not the shape of the boundary part of the evaluation semiconductor wafer is a shape desired in a product semiconductor wafer, the description related to the determination of a non-defective product in the first manufacturing method and the second manufacturing method provided earlier can be referred to.

Known techniques related to a semiconductor wafer manufacturing method can be applied to other details of the first manufacturing method, the second manufacturing method, and the third manufacturing method.

EXAMPLES

Hereinafter, the present invention will be further described based on Examples. However, it is to be understood that the present invention is not limited to an embodiment represented by Examples.

1. Description of Apparatus

Figure 2:
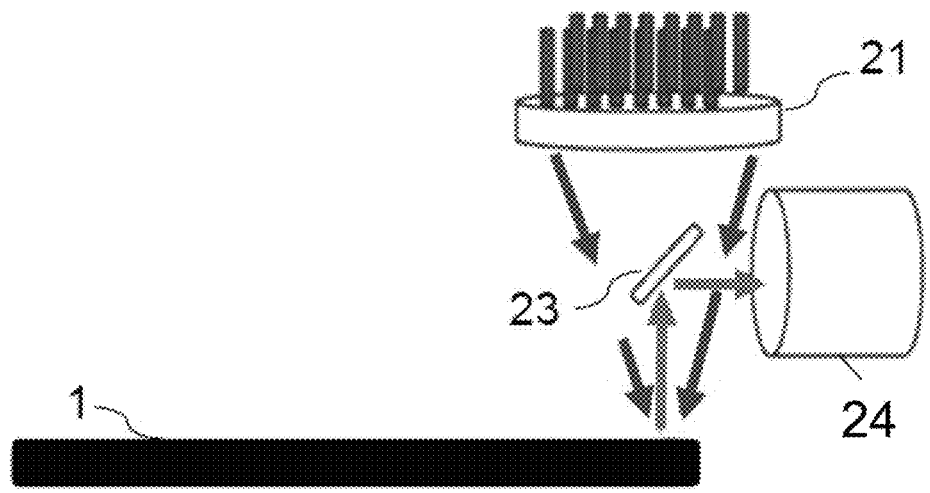
FIG. 2 shows a schematic configuration diagram of a light-irradiating system and a light-receiving system which are used in order to acquire a scattered image in Examples.

Hereinafter, acquisition of a reflection image (a bright-field image) and acquisition of a scattered image (a dark-field image) were performed using an automated appearance inspection system (AWX EBI300N) manufactured by Rudolph Technologies, Inc. with respect to a front surface side of a semiconductor wafer to be evaluated. This automated appearance inspection system is an apparatus capable of holding a semiconductor wafer by chucking a wafer end surface part and rotating the semiconductor wafer around a main surface normal direction. FIG. 1 shows a schematic configuration diagram of a light-irradiating system and a light-receiving system for acquiring a reflection image, and FIG. 2 shows a schematic configuration diagram of a light-irradiating system and a light-receiving system for acquiring a scattered image. In FIGS. 1 and 2, arrows schematically indicate directions in which light travels.

As shown in FIG. 1, the light-irradiating system for acquiring a reflection image includes a light source 11 and a mirror 12. By changing the direction in which light emitted from the light source 11 travels with the mirror 12, light irradiation is performed from upward in a vertical direction (a 0° direction) of a boundary part, the shape of which is a target of the evaluation. By using a mirror 13 to change a travel direction of reflected light from a semiconductor wafer irradiated with light in this manner, the reflected light is guided to a light-receiving section 14. The light source 11 is a coaxial LED having an emission wavelength in a visible light region. On the other hand, the light-irradiating system for acquiring a scattered image includes a light source 21. The light source 21 includes 16 LEDs which are arranged at regular intervals on a same circumference and which have an emission wavelength in a visible light region, and the light source 21 is configured such that light emitted from each of the 16 LEDs irradiate a same location. Light irradiation is performed by the light source 21 from at least outside of upward in the vertical direction of the boundary part, the shape of which is a target of the evaluation (specifically, from at least a 20° outside direction and a 40° outside direction). By using a mirror 23 to change a travel direction of scattered light from a semiconductor wafer irradiated with light in this manner, the scattered light is guided to a light-receiving section 24. For example, the light-receiving section can be a line scan camera. Hereinafter, a line scan camera provided in the automated appearance inspection system described above was used as the light-receiving sections 14 and 24.

2. Description of Evaluation Method

Figure 3:
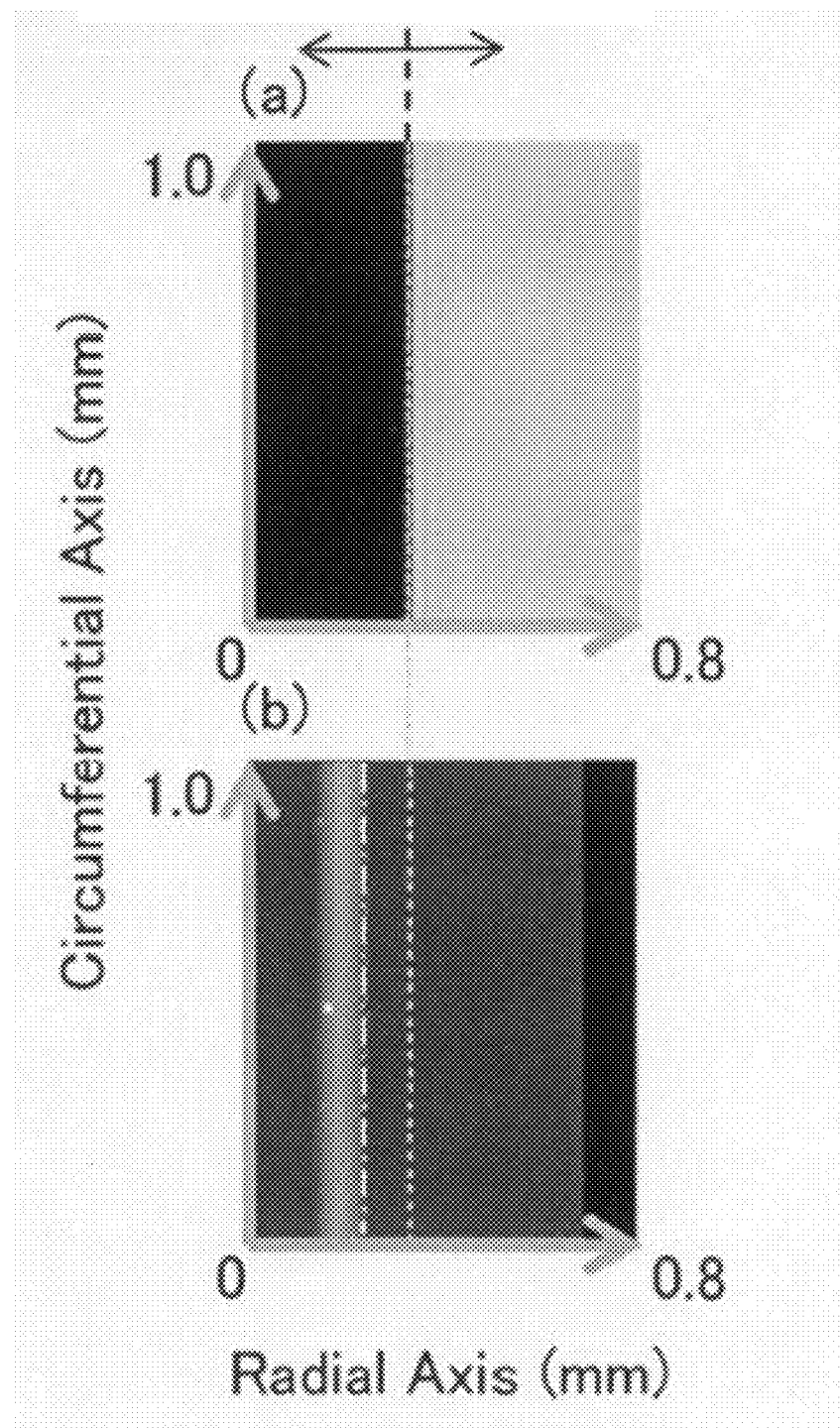
FIG. 3 shows an example in which a reflection image and a scattered image obtained with respect to a same location of a same semiconductor wafer of which a wafer outer peripheral edge section is subjected to chamfering are arranged side by side.

FIG. 3 shows an example in which a reflection image and a scattered image obtained by the apparatus described above with respect to a same location of a same semiconductor wafer with a wafer outer peripheral edge section subjected to chamfering are arranged side by side. In FIG. 3, an image (a) is a reflection image and an image (b) is a scattered image. A bright zone in the scattered image was identified as a region with a brightness equal to or higher than 0, with 0 being a threshold of the brightness. In FIG. 3, a distance (a shortest distance between a dashed line and a one dot-dashed line in an upper part of FIG. 3(*b*)) between a bright portion region of the reflection image (a bright-field image) and a bright part region of the scattered image (a dark-field image) is denoted by L.

3. Description of Evaluation Method for Acquiring Reference Value

Verification of L obtained by the evaluation method according to an aspect of the present invention being a value that can be used as an index of a shape of a boundary part can be made when, for example, a reference value obtained by an evaluation method described below and L obtained by the evaluation method according to an aspect of the present invention exhibits preferable correlation.

First, with respect to a semiconductor wafer, a cross-sectional image including a boundary part to be evaluated is obtained. The cross-sectional image can be acquired by, for example, cleaving the semiconductor wafer at a cleavage surface and capturing an image of an exposed cross section with a microscope.

An enlarged image that enlarges the acquired cross-sectional image only in a wafer thickness direction is created. By magnifying the cross-sectional image only in the wafer thickness direction, since a shape of the boundary part can be enhanced with respect to the main surface (a so-called horizontal surface) in a contour of a cross-sectional shape, using the enlarged image enables a gentleness/steepness of the boundary part to be evaluated with higher accuracy as compared to using the cross-sectional image that has not been enlarged. By further subjecting the enlarged image to a binarization process, since the contour of the cross-sectional shape can be more vividly displayed, the gentleness/steepness of the boundary part can be evaluated with even higher accuracy.

Figure 6:
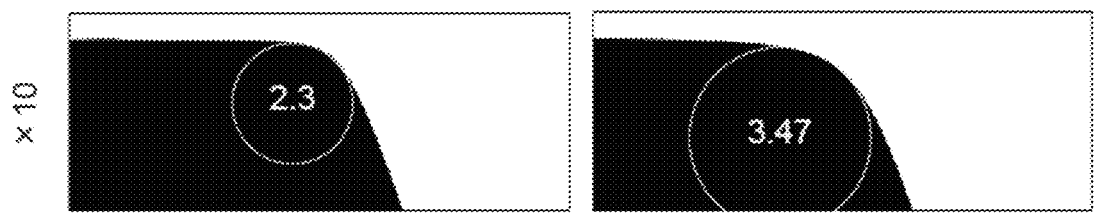
FIG. 6 shows an example of an evaluation result by an evaluation method for obtaining the reference value.

In a binarized image obtained in this manner, a shape of the boundary part between the main surface and the chamfered surface is normally a curved line shape in the contour of the wafer cross-sectional shape. In consideration thereof, the shape of the curved line of the boundary part between the main surface and the chamfered surface is fitted with a circle having an arc shape that approximates or matches the shape of the curved line. A determination can be made that the larger a size such as a diameter or a radius of the circle (the circle of curvature) obtained in this manner, the gentler the shape of the boundary part, and a determination can be made that the smaller the size of the circle, the steeper the shape of the boundary part. As an example, FIG. 6 shows binarized images (images obtained by performing a 10-fold enlargement only in the wafer-thickness direction and subsequently performing a binarization process) obtained by the method described above with respect to two semiconductor wafers of different types. FIG. 6 also shows circles with arcs that approximately match the shape of curved lines of the boundary part. Numerical values shown in circles represent diameters of the circles. In FIG. 6, a comparison between cross-sectional shapes of sample 1 and sample 2 reveals that a shape of a boundary part of sample 2 is gentler than a shape of a boundary part of sample 1. A comparison between sample 1 and sample 2 with respect to sizes of circles reveals that a diameter of the circle obtained with respect to sample 2 is larger than a diameter of the circle obtained with respect to sample 1. As described above, a size of a circle and a shape of the boundary part are correlated.

4. Evaluation of Semiconductor Wafer

(1) Measurement of Distance L

Four types of semiconductor wafers (300 mm-diameter silicon single-crystal wafers (polished wafers) with a surface being a (100) plane) with different polishing conditions and chamfering conditions of a wafer surface were prepared. Hereinafter, the four types of semiconductor wafers described above will be respectively referred to as "wafer 1", "wafer 2", "wafer 3", and "wafer 4". Assuming that a notched part of the semiconductor wafers is 0°, a reflection image and a scattered image were acquired using the apparatus described in 1 above at a 45° location in a counter-clockwise direction, and the obtained reflection image and the obtained scattered image were arranged as described in 2 above to obtain the distance L between the bright zone of the reflection image and the bright zone of the scattered image.

(2) Acquisition of Reference Value

The four types of semiconductor wafers evaluated in (1) above were respectively cleaved at a (110) plane to fabricate cross-sectional observation specimens.

Brightness and contrast of the fabricated cross-sectional observation specimens were adjusted using a differential interference microscope to acquire cross-sectional images (imaging magnification: 500 times) including the boundary part evaluated in 3. above.

The acquired cross-sectional images were loaded to image processing software (Photoshop CS5 made by Adobe Inc.) and, after magnifying the cross-sectional images by 10 times only in the wafer thickness direction, a binarization process was performed.

Figure 7:
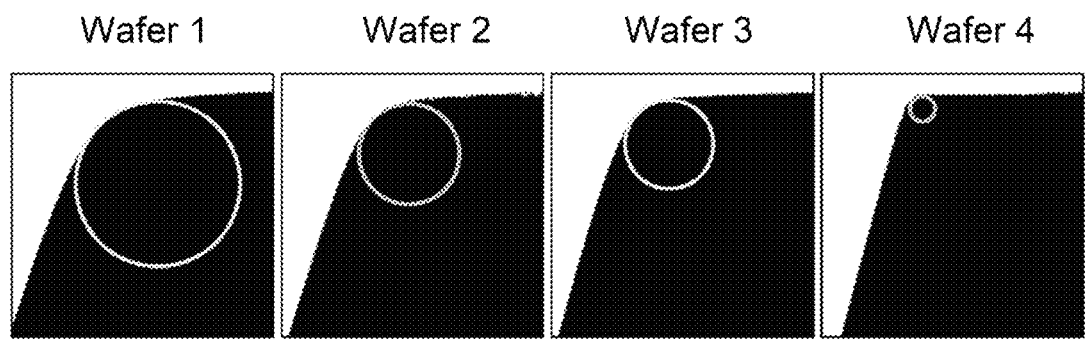
FIG. 7 shows an evaluation result obtained by an evaluation method for obtaining the reference value with respect to the semiconductor wafer evaluated in Examples.

The binarized images obtained by performing the binarization process were loaded to software (PowerPoint made by Microsoft Corporation) and, using a graphic drawing tool of the software, a circle with an arc shape approximately matching a shape of a curved line of a boundary part was drawn on a contour of a cross-sectional shape. The approximate matching of the shape of the curved line and the shape of the arc was visually determined. With respect to each semiconductor wafer, a diameter of a circle drawn in this manner is adopted as a reference value. FIG. 7 shows binarized images (images obtained by performing a 10-fold enlargement only in the wafer-thickness direction and subsequently performing a binarization process) obtained by the method described above. FIG. 7 also shows circles with arcs that approximately match the shape of curved lines of the boundary part.

(3) Evaluation Result

Table 1 shows L obtained in (1) above and a reference value (a size (diameter) of a circle) obtained in (2) above with respect to each semiconductor wafer. In addition, FIG. 4 shows a graph that plots values of L obtained in (1) above with respect to the reference value (a diameter of a circle) obtained in (2) above with respect to each semiconductor wafer.

TABLE 1

|  | Distance L (µm) | Size of circle (diameter) Unit: arbitrary unit |
|---|---|---|
| Wafer 1 | 112 | 4.71 |
| Wafer 2 | 77 | 2.88 |
| Wafer 3 | 56 | 2.54 |
| Wafer 4 | 21 | 0.71 |

Figure 4:
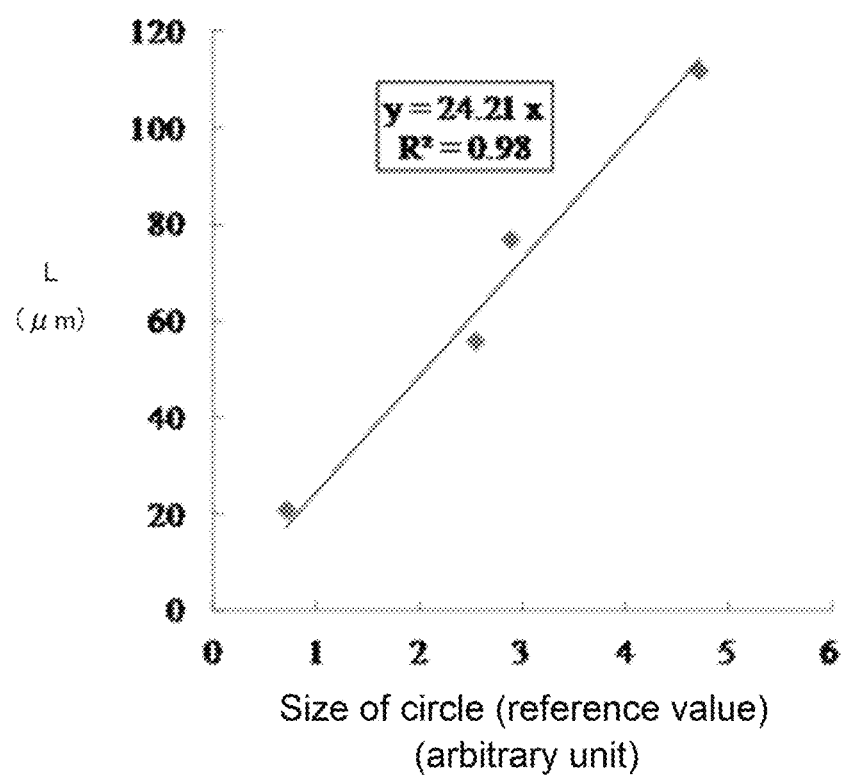
FIG. 4 shows a graph which plots values of L obtained in Examples with respect to a reference value.

FIG. 4 also shows an approximated straight line obtained by a least square method with respect to four plots. An approximated straight line represents a correlation coefficient squared $R^2$ of 0.98, which indicates an extremely favorable correlation. This result shows that a value of L obtained in (1) above can be used as an index of a shape evaluation of the boundary part.

The value of L obtained in this manner can be used for a pre-shipment inspection, for a sampling inspection from a lot, and for determining actual manufacturing conditions of a semiconductor wafer as described above.

5. Evaluation at Plurality of Locations of Same Semiconductor Wafer

Figure 5:
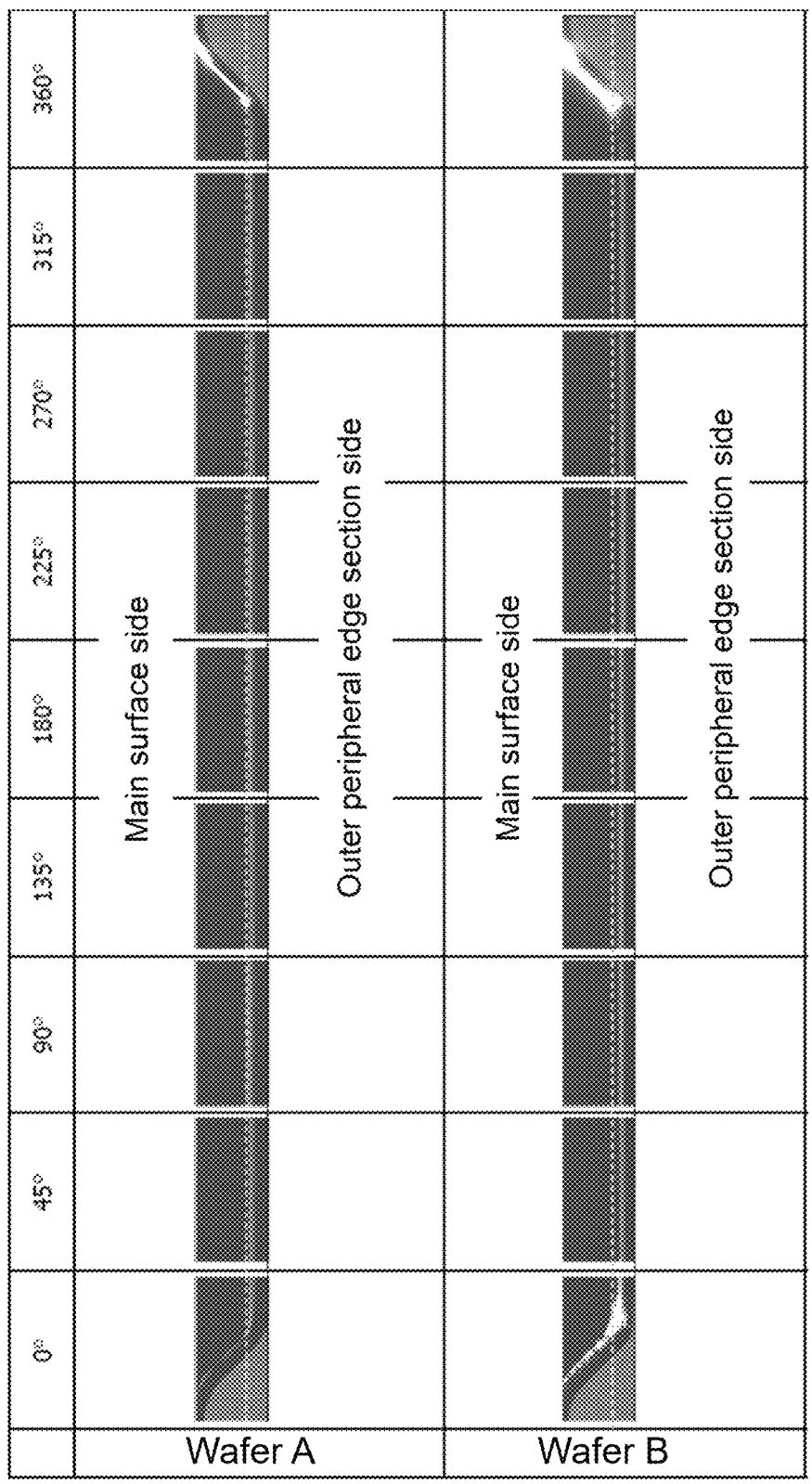
FIG. 5 shows an evaluation result respectively obtained at a plurality of locations of two types of semiconductor wafers in Examples.

Two types of semiconductor wafers (300 mm-diameter silicon single-crystal wafers (polished wafers) with a surface being a (100) plane) with a wafer outer peripheral edge section having been subjected to chamfering were prepared. Hereinafter, the two types of semiconductor wafers described above will be respectively referred to as "wafer A" and "wafer B". Assuming that a notched part of the semiconductor wafers is 0°, a reflection image and a scattered image were acquired using the apparatus described in 1 above at locations at different angles in a counterclockwise direction. FIG. 5 shows images created by adding, to a scattered image obtained at each location, a dashed line corresponding to a boundary of a bright part region identified using a reflection image obtained at the same location. A threshold of brightness is set in the scattered images, and a region of which brightness is equal to or higher than the threshold (for example, brightness 0) on the scattered image acquired at each location of wafer A and wafer B is identified as a bright zone. The distance L is obtained as a shortest distance between an end of the bright zone identified on the scattered image acquired at each location and the dashed line (in other words, an end of the bright zone identified on the reflection image). By using L obtained with respect to each location in this manner as an index, the shape of the boundary part at each location can be evaluated. A value of the distance L at each location of wafer B was larger than a value of the distance L at each location of wafer A. From this result, the shape of the boundary part at each location of wafer B can be determined to be gentler than that of wafer A.

The acquisition of the reflection image and the acquisition of the scattered image described above were performed after adjusting the apparatus described in 1 above so that locations at which a reflection image and a scattered image are to be acquired are irradiated with light by chucking a wafer end surface part and rotating the wafer around a main surface normal direction.

An aspect of the present invention is useful in the field of manufacturing various types of semiconductor wafers such as a silicon wafer.

What is claimed is:

1. A method of evaluating a semiconductor wafer, the method comprising:
    acquiring a reflection image as a bright-field image by receiving reflected light which is obtained when irradiating one surface side of a semiconductor wafer to be evaluated with light;
    acquiring a scattered image as a dark-field image by receiving scattered light which is obtained when irradiating the surface side of the semiconductor wafer to be evaluated with light; and
    obtaining a distance L between a bright zone that is observed in the reflection image and a bright zone that is observed in the scattered image,
    wherein the semiconductor wafer to be evaluated is a semiconductor wafer in which a chamfered surface is formed in a wafer outer peripheral edge section, and
    the method further comprising:
    evaluating, based on L, a shape of a boundary part between a main surface on the surface side irradiated with the light of the semiconductor wafer to be evaluated and a chamfered surface adjacent to the main surface, and
    acquiring the scattered image by irradiating a portion that includes at least a region on a side of the boundary part of the chamfered surface and a region on a side of the chamfered surface of the boundary part with light from a direction ranging from a 10° outside direction to a 50° outside direction, relative to upward in a vertical direction of the boundary part as a 0° direction and a wafer radial direction which is perpendicular to the 0° direction and which passes through the boundary part as a 90° direction.

2. The method of evaluating a semiconductor wafer according to claim 1, which comprises acquiring the reflection image by irradiating a portion that includes at least a region on a side of the boundary part of the main surface and a region on a side of the main surface of the boundary part with light from upward in a vertical direction of the boundary part.

3. The method of evaluating a semiconductor wafer according to claim 1, which comprises acquiring the scattered image and the reflection image a plurality of times by rotating the semiconductor wafer to be evaluated around a normal direction of the main surface, and obtaining L at a plurality of different locations of the semiconductor wafer to be evaluated.

4. A method of manufacturing a semiconductor wafer, the method comprising:
    manufacturing a semiconductor wafer to be a candidate for shipping as a product;
    evaluating the candidate semiconductor wafer by the evaluation method according to claim 1; and
    subjecting a semiconductor wafer determined to be a non-defective product as a result of the evaluation to preparation for shipment as a product semiconductor wafer.

5. A method of manufacturing a semiconductor wafer, the method comprising:
    manufacturing a semiconductor wafer lot including a plurality of semiconductor wafers;
    extracting at least one semiconductor wafer from the semiconductor wafer lot;
    evaluating the extracted semiconductor wafer by the evaluation method according to claim 1; and
    subjecting semiconductor wafers belonging to a same semiconductor wafer lot as a semiconductor wafer determined to be a non-defective product as a result of the evaluation to preparation for shipment as product semiconductor wafers.

6. A method of manufacturing a semiconductor wafer, the method comprising:
    manufacturing an evaluation semiconductor wafer under a test manufacturing condition;
    evaluating the manufactured evaluation semiconductor wafer by the evaluation method according to claim 1;
    determining a manufacturing condition created by modifying the test manufacturing condition as an actual manufacturing condition or determining the test manufacturing condition as the actual manufacturing condition on the basis of a result of the evaluation; and
    manufacturing semiconductor wafers under the determined actual manufacturing condition.

7. The method of manufacturing a semiconductor wafer according to claim 6, wherein the manufacturing condition to be modified is at least one of a polishing condition and a chamfering condition of a semiconductor wafer surface.

* * * * *